United States Patent
Li et al.

(10) Patent No.: US 8,616,902 B2
(45) Date of Patent: Dec. 31, 2013

(54) POWER SUPPLY DEVICE AND POWER SUPPLY SYSTEM FOR SERVER RACK

(75) Inventors: Han-Yu Li, New Taipei (TW); Ning Zhang, Shenzhen (CN); Guang-Dong He, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/455,239

(22) Filed: Apr. 25, 2012

(65) Prior Publication Data

US 2013/0017693 A1    Jan. 17, 2013

(30) Foreign Application Priority Data

Jul. 14, 2011    (CN) .......................... 2011 1 0196979

(51) Int. Cl.
   *H01R 25/00*    (2006.01)
(52) U.S. Cl.
   USPC .......................................................... 439/110
(58) Field of Classification Search
   USPC ................................ 439/110, 212; 361/727
   See application file for complete search history.

(56) References Cited

U.S. PATENT DOCUMENTS

| | | | | |
|---|---|---|---|---|
| 6,111,745 A * | 8/2000 | Wilkie et al. | ................. | 361/605 |
| 6,297,962 B1 * | 10/2001 | Johnson et al. | ............... | 361/726 |
| 6,351,375 B1 * | 2/2002 | Hsieh et al. | ............. | 361/679.33 |
| 6,741,463 B1 * | 5/2004 | Akhtar et al. | ............ | 361/679.41 |
| 6,839,237 B2 * | 1/2005 | Berry et al. | .................... | 361/727 |
| 7,440,260 B2 * | 10/2008 | Parker et al. | .................. | 361/620 |
| 7,791,890 B2 * | 9/2010 | Ishida | ............................ | 361/727 |
| 2011/0304958 A1 * | 12/2011 | Dozier | .......................... | 361/634 |
| 2013/0058028 A1 * | 3/2013 | Lu et al. | .................... | 361/679.31 |

\* cited by examiner

*Primary Examiner* — Neil Abrams
*Assistant Examiner* — Travis Chambers
(74) *Attorney, Agent, or Firm* — Altis Law Group, Inc.

(57) ABSTRACT

The power supply device includes a main bus-bar assembly, an assistant bus-bar assembly, and a plurality of connectors being electronically connected to the assistant bus-bar assembly. The main bus-bar assembly includes a first main bus-bar and a second main bus-bar attached to the first main bus-bar. The assistant bus-bar assembly includes a first assistant bus-bar and a second assistant bus-bar attached to the first assistant bus-bar. The first assistant bus-bar is electronically connected to the first main bus-bar, and the second assistant bus-bar is connected to the second main bus-bar. Each of the plurality of connector includes a first pin and a second pin. The first pin is engaged with the first assistant bus-bar, and the second pin is engaged with the second assistant bus-bar.

20 Claims, 7 Drawing Sheets

US 8,616,902 B2

POWER SUPPLY DEVICE AND POWER SUPPLY SYSTEM FOR SERVER RACK

BACKGROUND

1. Technical Field

The present disclosure relates to a power supply device and a power supply system for a server rack.

2. Description of Related Art

Blade and rack-mounted servers are popular form factors for data center servers. In order to achieve high performance, many rack-mounted servers are clustered in an enclosure. Usually, a server rack assembly includes a server rack and a plurality of servers received in the server rack. Each of the plurality of servers is connected to a power supply, and the power supply may include a power transforming module and a power settle module. Thus, the power supplies, including the power transforming modules and the power settle modules, are received in the server rack. When the plurality of servers need maintenance, it can be confusing to service the plurality of servers because of the power transforming modules and the power settle modules. Therefore, an improved power supply device and an improved power supply system for a server rack with the power supply device may be desired within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
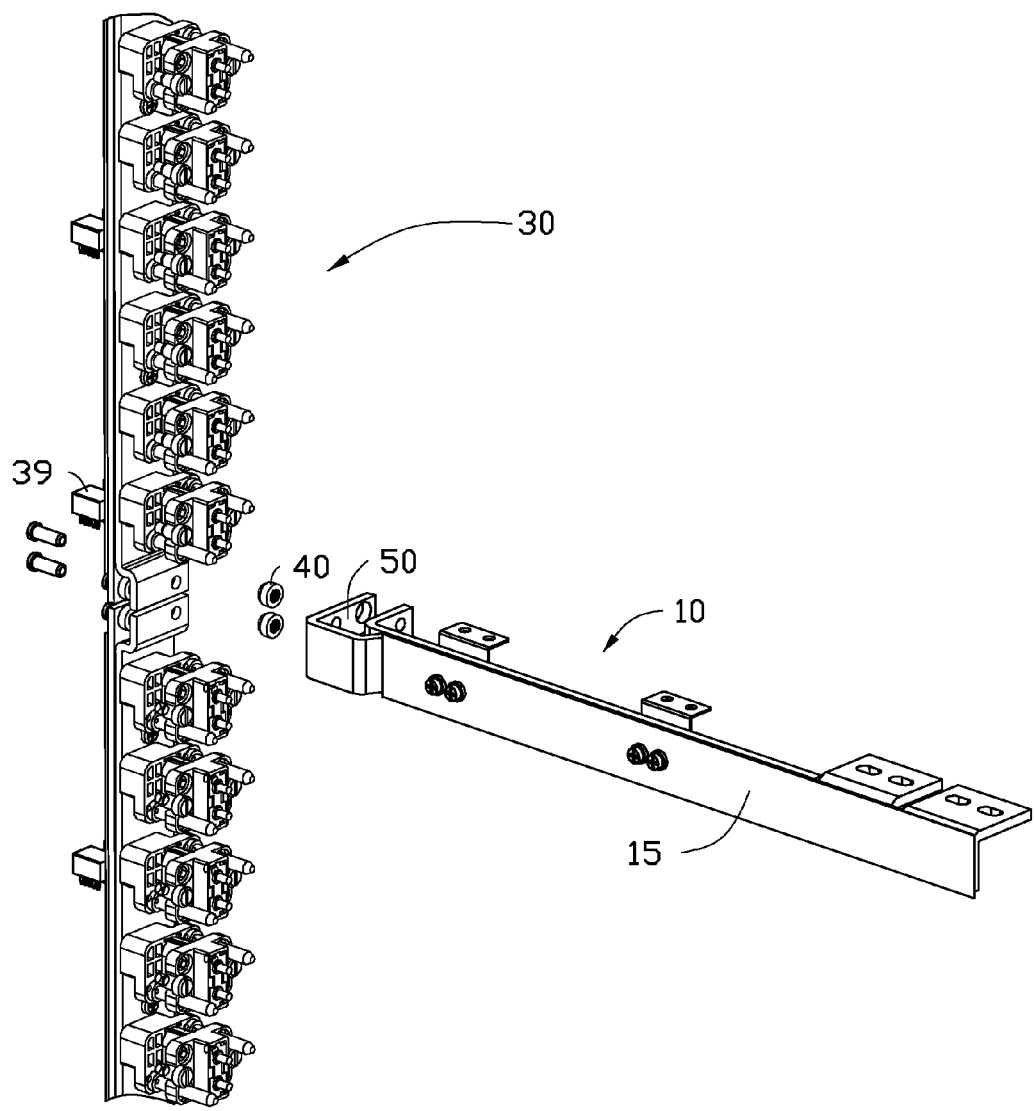
FIG. 1 is an exploded, isometric view of a power supply device in accordance with an embodiment.
Figure 2:
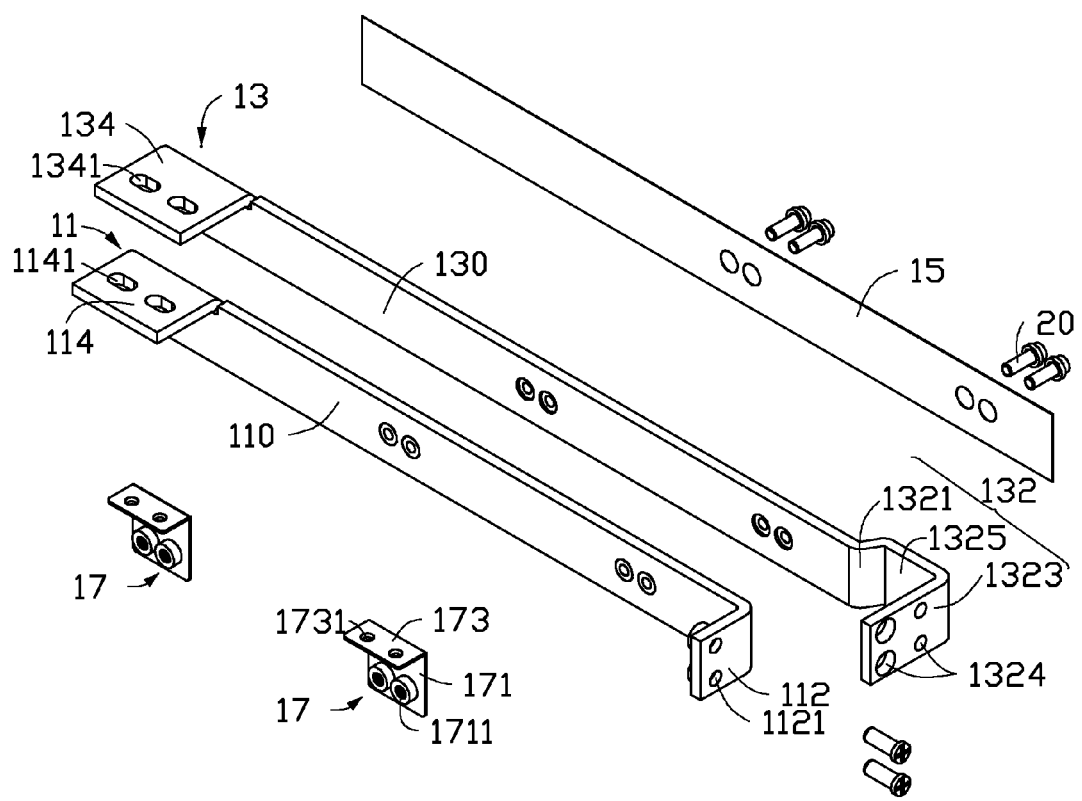
FIG. 2 is an exploded, isometric view of a main bus-bar assembly of the power supply device of FIG. 1.
Figure 3:
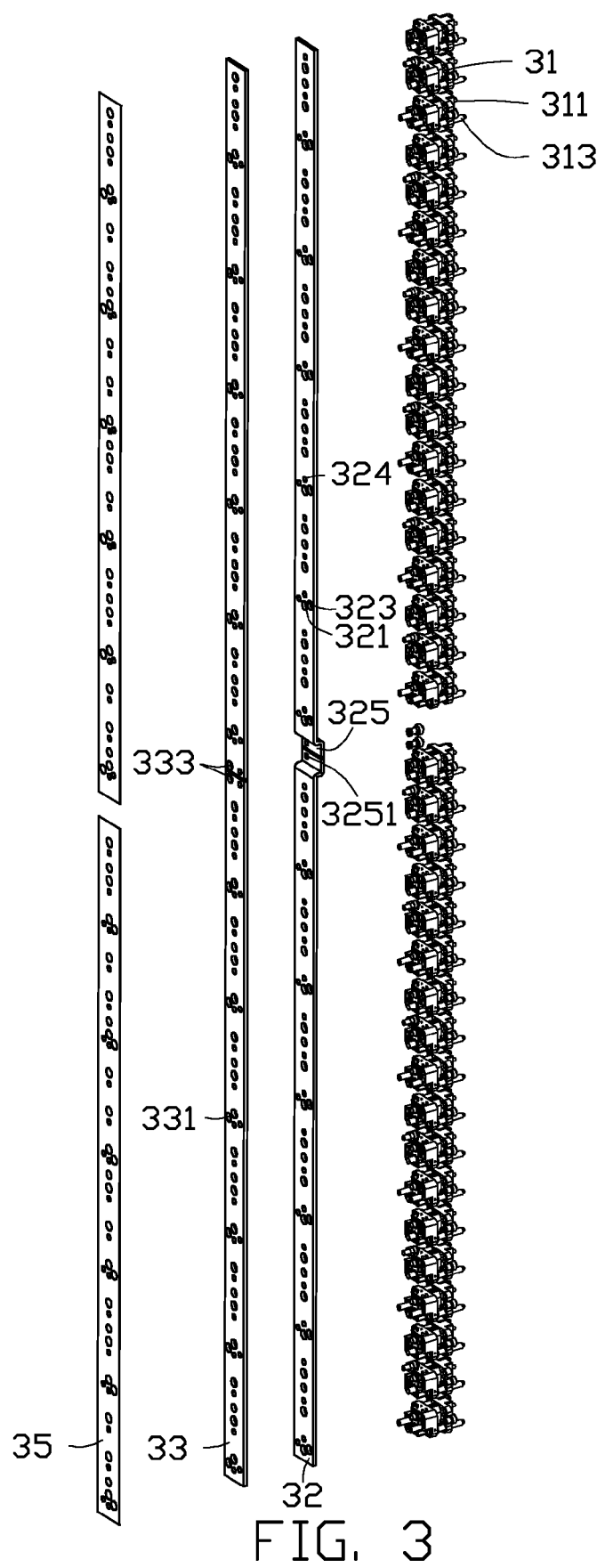
FIG. 3 is an exploded, isometric view of an assistant bus-bar assembly of the power supply device of FIG. 1.
Figure 4:
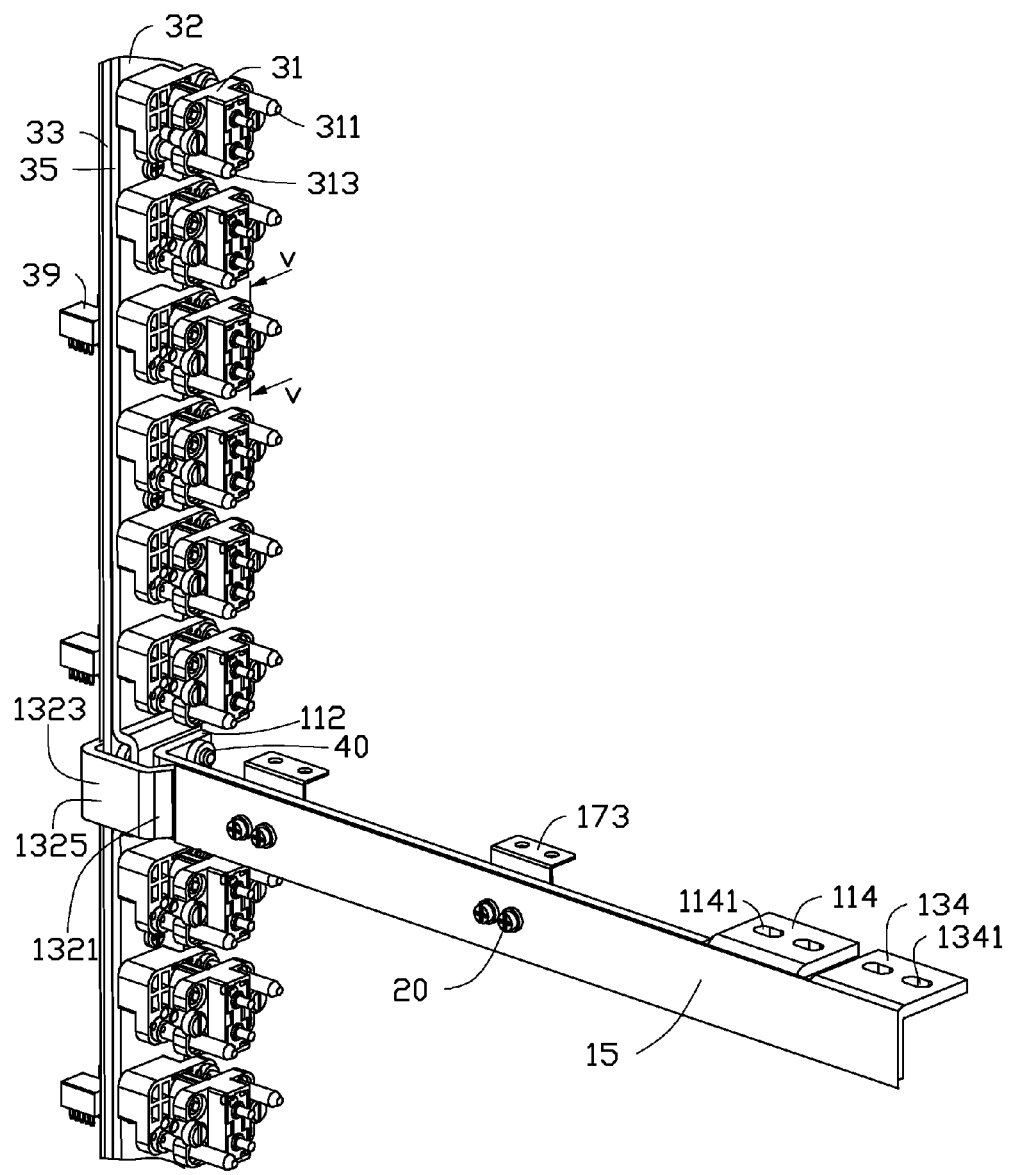
FIG. 4 is an assembled view of FIG. 1.
Figure 5:
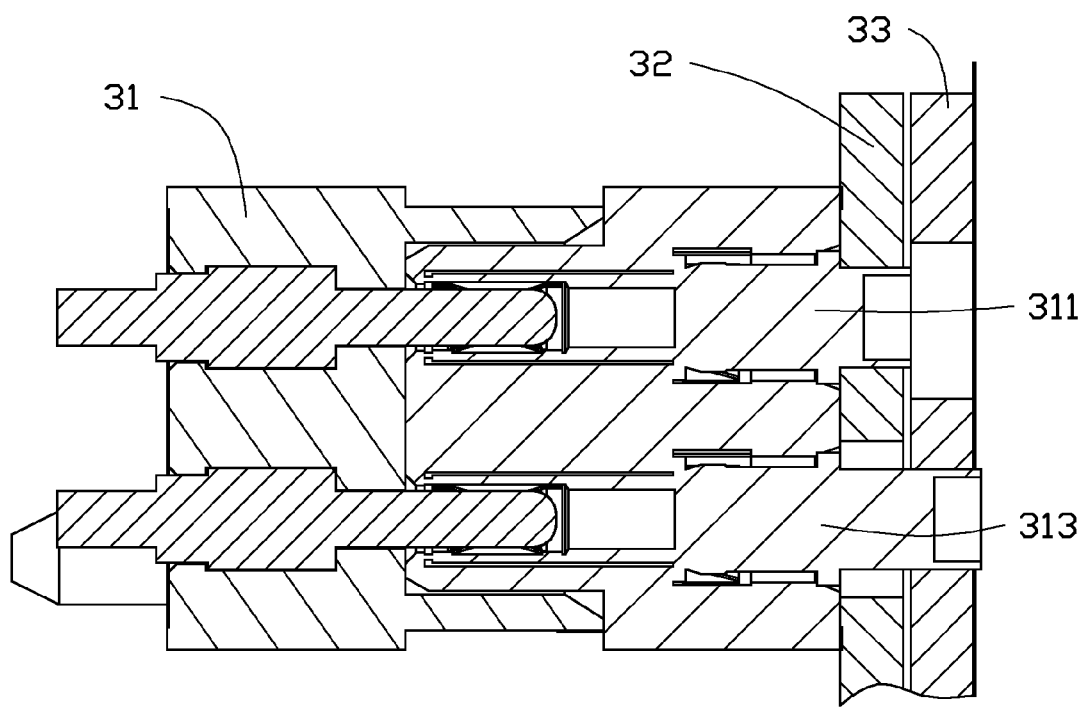
FIG. 5 is a partially cross section view of FIG. 4 along line V-V.

FIGS. 1 and 2, show a power supply device including a main bus-bar assembly 10, and an assistant bus-bar assembly 30 electronically connected to the main bus-bar assembly 10.

The main bus-bar assembly 10 includes a first main bus-bar 11, a second main bus-bar 13, a gasket 15, and two securing members 17. In one embodiment, a cross-section of the first main bus-bar 11 is a rectangle, the first main bus-bar 11 is a copper bus-bar, and the second main bus-bar 13 has a same configuration as the first main bus-bar 11. The first main bus-bar 11 can transmit electricity, and the second main bus-bar 13 can be grounded. In one embodiment, two first insulating members (not shown) can be attached to the first main bus-bar 11, and two second insulating members (not shown) can be attached to the second main bus-bar 13.

The first main bus-bar 11 includes a first board 110, a mounting portion 112 located on a first end of the first board 110, a first power guiding portion 114 located on a second end of the first board 110. The mounting portion 112 defines a mounting hole 1121, and the first power guiding portion 114 defines two power guiding holes 1141. In one embodiment, the mounting portion 112 is substantially perpendicular to the first power guiding portion 114.

The second main bus-bar 13 includes a second board 130, a securing portion 132 located on a first end of the second board 130, and a second power guiding portion 134 located on a second end of the second board 130 opposite to the first end. The second power guiding portion 134 defines two power guiding holes 1341. The securing portion 132 includes a first connecting piece 1321, a securing piece 1323 and a second connecting piece 1325 connected to the first connecting piece 1321 and the securing piece 1323. The securing piece 1323 defines four securing holes 1324. In one embodiment, the first connecting piece 1321 is slanted relative to the second board 130, and the securing piece 1323 is substantially perpendicular to the second connecting piece 1325.

Each of the two securing members 17 includes a first securing panel 171 and a second securing panel 173 connected to the first securing panel 171. The first securing panel 171 defines two first securing holes 1711, and the second securing panel 173 defines two second securing holes 1731.

The assistant bus-bar assembly 30 includes a plurality of connectors 31, a first assistant bus-bar 32, a second assistant bus-bar 33, and an insulating member 35. In one embodiment, a cross-section of the first assistant bus-bar 32 is a rectangle, the first assistant bus-bar 32 is a copper bus-bar, and the second assistant bus-bar 33 has a same configuration as the first assistant bus-bar 32. The first assistant bus-bar 32 transmits electricity, and the second assistant bus-bar 33 can be grounded. In one embodiment, two first insulating members (not shown) can be attached to the first assistant bus-bar 32, and two second insulating members (not shown) can be attached to the second assistant bus-bar 33.

Each of the plurality of connectors 31 includes a first pin 311 and a second pin 313. In one embodiment, a length of the first fin 311 is less than that of the second pin 313.

The first assistant bus-bar 32 defines a plurality of first receiving holes 321 and a plurality of through holes 323. A retaining portion 325 is located on the first assistant bus-bar 32, and the retaining portion 325 defines two retaining holes 3251 corresponding to the mounting holes 1121.

The second assistant bus-bar 33 defines a plurality of second receiving holes 331 and four positioning holes 333. The four positioning holes 333 correspond to the four securing holes 1324.

Referring to FIGS. 1-5, in assembly, the first assistant bus-bar 32 is attached to the second assistant bus-bar 33, and a gap is defined between the retaining portion 325 and the second assistant bus-bar 33. The first pin 311 of each of the plurality of connectors 31 is engaged in the plurality of first receiving holes 321. The second pin 313 of each of the plurality of connectors 31 extends through each of the plurality of through holes 323 and the insulating member 35, to engage in the second receiving hole 332. Thus, the plurality of connectors 31 are secured to the first and the second assistant bus-bars 32, 33.

The first main bus-bar 11 is attached to the second main bus-bar 13. Two mounting members 20, such as screws, extend through holes (not shown) of the gasket 15, holes (not labeled) of the second board 130, holes (not labeled) of the first board 110, to engage in the two first securing holes 1711. Thus, the gasket 15, the first and the second main bus-bar 11, 13, and the two securing members 17 are secured together. Then, a receiving space 50 is defined between the mounting portion 112 and the securing portion 132, and the mounting portion 112 is substantially parallel to the securing piece 1323. In one embodiment, the first main bus-bar 11 can be secured to the second main bus-bar 13 by hooks, or jointing.

The assistant bus-bar assembly 30 is moved downward and engaged in the receiving space 50. The retaining portion 325 abuts the mounting portion 112, and the second assistant bus-bar 33 abuts the securing piece 1323. The two retaining holes 3251 are aligned with two of the mounting holes 1121. Two fixing members 40 are engaged in the two retaining holes 3251 and the mounting holes 1121, to secure the first main bus-bar 11 to the first assistant bus-bar 32. The four securing holes 1324 are aligned with the four positioning holes 333. Four fixing members (not shown) are engaged in the four securing holes 1324 and the four positioning holes 333, to secure the second main bus-bar 13 to the second assistant bus-bar 33. In one embodiment, the main bus-bar assembly 10 is substantially perpendicular to the assistant bus-bar assembly 30, and the main bus-bar assembly 10 is located on a center of the assistant bus-bar assembly 30. A plurality of electronic connecting members 39 are attached to the assistant bus-bar assembly 30, to connect a plurality of electronic components (not shown).

Figure 6:
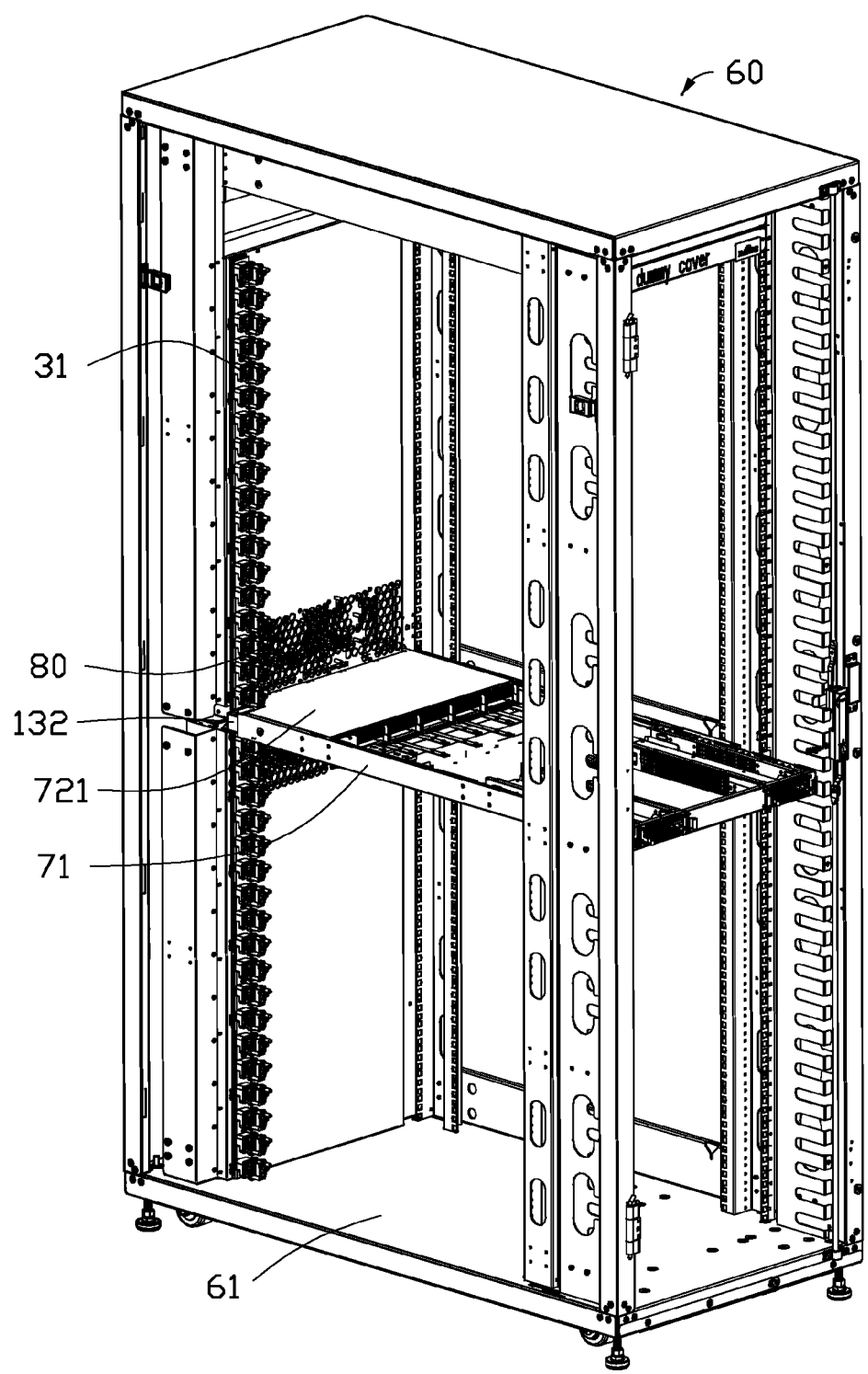
FIG. 6 is an assembled view of the power supply device and a server rack in accordance with an embodiment.
Figure 7:
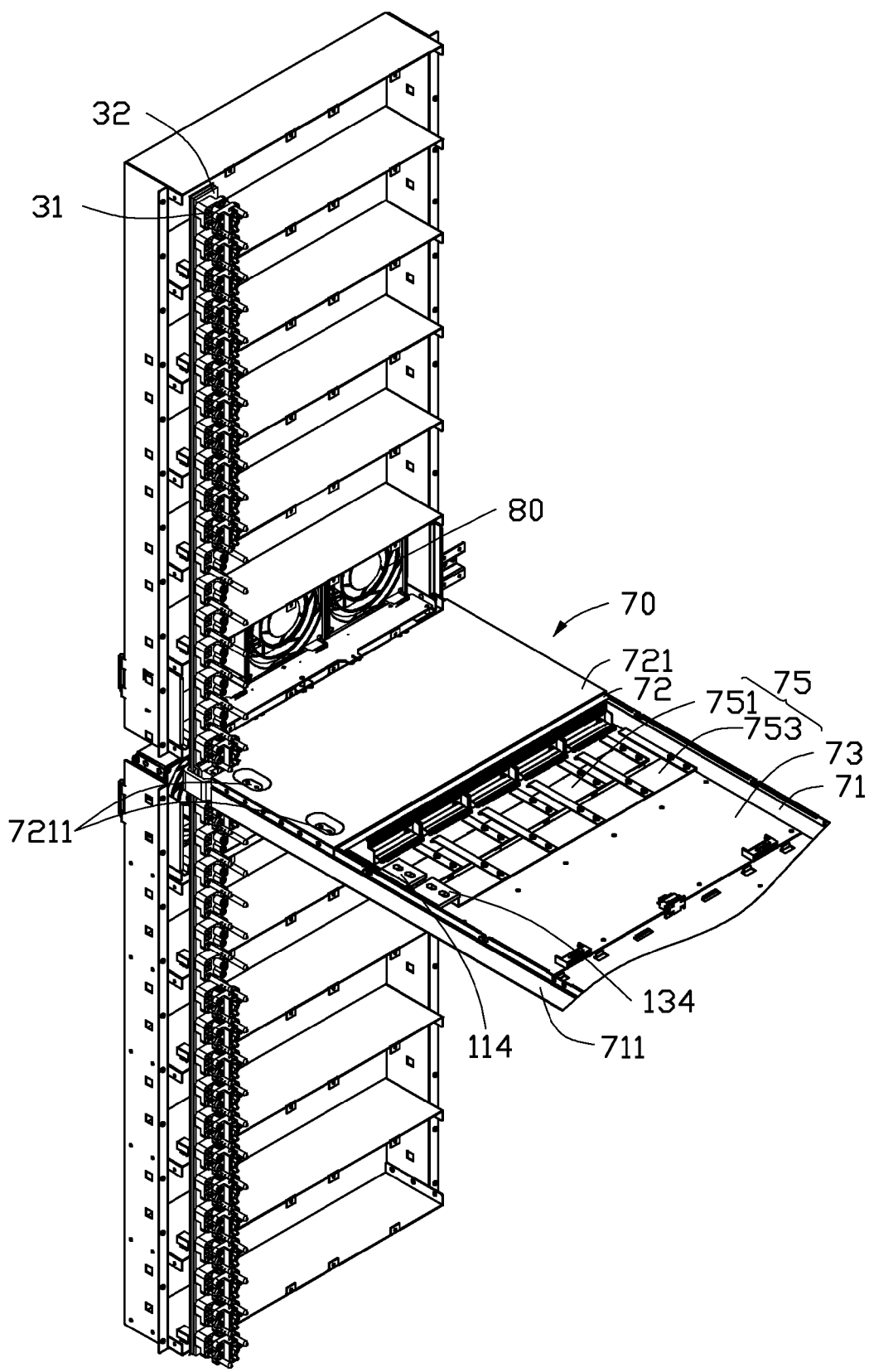
FIG. 7 is an assembled view of the power supply device and a power supply assembly in accordance with an embodiment.

FIGS. 6-7, show the power supply device can be located in a server rack 60. The server rack 60 includes a bottom plate 61, and a power supply assembly 70 located in the server rack 60 in a direction substantially parallel to the bottom plate 61. The power supply assembly 70 is electronically connected to the power supply device. The plurality of connectors 31 are arranged on a side of the server rack in a direction substantially perpendicular to the bottom plate 61.

The power supply assembly 70 includes a chassis 71, a power supply 72 received in the chassis 71, a circuit board 73 electronically connected to the power supply 72, and an electroconductive plate assembly 75 electronically connected to the circuit board 73. The chassis 71 includes a side plate 711 attached to the main bus-bar assembly 10. The power supply 72 includes a top panel 721, and two positioning portions 7211 defined on the top panel 721. The two positioning portions 7211 are secured to the two second securing panel 173 by screws. The circuit board 73 is used to distribute power to the electroconductive plate assembly 75. The electroconductive plate assembly 75 includes a first electroconductive plate 751 and a second electroconductive plate 753. The first electroconductive plate 751 can be a live wire to be electronically connected to the first power guiding portion 114. The second electroconductive plate 753 can be a ground wire to be electronically connected to the second power guiding portion 134. In one embodiment, the first and second electroconductive plates 751, 753 are made of copper.

A plurality of servers (not shown) are receive in the server rack 60, and a plurality of fans 80 are arranged at a side of the power supply assembly 70. Each of the plurality of servers is electronically connected to each of the plurality of connectors 31. Each of the plurality of fans 80 is electronically connected to the assistant bus-bar assembly 30 by the plurality of electronic connecting members 39. In one embodiment, a first distance of every adjacent two of the plurality of servers is 1U (1U=1.75 inch), and a second distance of every adjacent two of the plurality of connectors 31 is 1U.

In use, power generated from the power supply 72 is transmitted to the circuit board 73. The circuit board 73 distributes power to the first and second electroconductive plates 751, 753. Thus, the power can be transmitted to the first and the second main bus-bars 11, 13 by the first and second electroconductive plates 751, 753, flowing through the first and the second assistant bus-bars 32, 33, and reaches each of the plurality of connectors 31 and each of the plurality of electronic connecting members 39. Therefore, each of the plurality of servers can be obtain power from the each of the plurality of connectors 31, and each of the plurality of fans 80 can be obtain power from each of the plurality of electronic connecting members 39.

When one of the plurality of servers needs to be maintained, one of the plurality of servers can be removed from one of the plurality of the connectors 31.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A power supply device comprising:
    a main bus-bar assembly comprising a first main bus-bar and a second main bus-bar abutting the first main bus-bar;
    an assistant bus-bar assembly comprising a first assistant bus-bar and a second assistant bus-bar abutting the first assistant bus-bar; and the first assistant bus-bar being electronically connected to the first main bus-bar, and the second assistant bus-bar being connected to the second main bus-bar; and
    a plurality of connectors being electronically connected to the assistant bus-bar assembly; each of the plurality of connector comprising a first pin and a second pin;
    wherein the plurality of connectors are arranged in a straight line that is substantially perpendicular to main bus-bar assembly, the first pin is engaged with the first assistant bus-bar, and the second pin is engaged with the second assistant bus-bar.

2. The power supply device of claim 1, wherein a cross-section of the main bus-bar assembly is a rectangle, and a cross-section of the assistant bus-bar assembly is a rectangle.

3. The power supply device of claim 1, wherein the assistant bus-bar assembly further comprising an insulating member, and the insulating member is attached to the second assistant bus-bar.

4. The power supply device of claim 1, wherein a length of the first pin is less than a length of the second pin.

5. The power supply device of claim 1, wherein the first main bus-bar comprises a first board and a mounting portion extending from the first board, the first assistant bus-bar comprising a retaining portion, and the retaining portion is secured to the mounting portion.

6. The power supply device of claim 5, wherein the second main bus-bar comprises a second board and a securing portion extending from the second board, and the assistant bus-bar assembly is positioned between the securing portion and the mounting portion.

7. The power supply device of claim 6, wherein the first main bus-bar comprises a first power guiding portion substantially perpendicular to the first board, the second main bus-bar comprises a second power guiding portion substantially perpendicular to the second board, and the second power guiding portion is attached to the first power guiding portion.

8. The power supply device of claim 6, wherein a receiving space is defined between the securing portion and the mounting portion, the assistant bus-bar assembly is received in the receiving space.

9. The power supply device of claim 8, wherein the securing portion comprises a first connecting piece, a securing piece, and a second connecting piece connected to the first connecting piece and to the securing piece, and the receiving space is defined by the mounting portion, the first connecting piece, the securing piece, and the second connecting piece.

10. The power supply device of claim 9, wherein the first connecting piece is slanted relative to the second board, and the securing piece is substantially perpendicular to the second connecting piece and substantially parallel to the mounting portion.

11. A power supply system comprising:
a server rack comprising a bottom plate;
a power supply assembly attached to the server rack in a first direction substantially parallel to the bottom plate; and
a power supply device comprising:
a main bus-bar assembly electronically connected to the power supply assembly and comprising a first main bus-bar and a second main bus-bar attached to the first main bus-bar;
an assistant bus-bar assembly comprising a first assistant bus-bar and a second assistant bus-bar attached to the first assistant bus-bar; and the first assistant bus-bar being electronically connected to the first main bus-bar, and the second assistant bus-bar being connected to the second main bus-bar; and
a plurality of connectors being electronically connected to the assistant bus-bar assembly; each of the plurality of connector comprising a first pin and a second pin;
wherein the first pin is engaged with the first assistant bus-bar, and the second pin is engaged with the second assistant bus-bar;
wherein the assistant bus-bar assembly is attached to the server rack in a second direction substantially perpendicular to the bottom plate, and the plurality of connectors are arranged on the assistant bus-bar assembly in the second direction.

12. The power supply system of claim 11, wherein the power supply assembly comprises a power supply, an electroconductive plate assembly, and a circuit board electronically connected to the power supply and to the electroconductive plate assembly, the electroconductive plate assembly comprises a first electroconductive plate and a second electroconductive plate, the first electroconductive plate is electronically connected to the first main bus-bar, and the second electroconductive plate is electronically connected to the second main bus-bar.

13. The power supply system of claim 11, further comprising a fan, wherein the assistant bus-bar assembly further comprises an electronic connecting member, and the electronic connecting member is electronically connected to the fan.

14. The power supply system of claim 11, wherein a cross-section of the main bus-bar assembly is a rectangle, and a cross-section of the assistant bus-bar assembly is a rectangle.

15. The power supply system of claim 11, wherein the assistant bus-bar assembly further comprising an insulating member, and the insulating member is attached to the second assistant bus-bar.

16. The power supply system of claim 11, wherein the securing portion comprises a first connecting piece, a securing piece, and a second connecting piece connected to the first connecting piece and the securing piece, a receiving space is defined by the mounting portion, the first connecting piece, the securing piece, and the second connecting piece, the assistant bus-bar assembly is received in the receiving space.

17. The power supply system of claim 11, wherein a length of the first pin is less than a length of the second pin.

18. The power supply system of claim 11, wherein the first main bus-bar comprises a first board and a mounting portion extending from the first board, the first assistant bus-bar comprising a retaining portion, and the retaining portion is secured to the mounting portion.

19. The power supply system of claim 18, wherein the second main bus-bar comprises a second board and a securing portion extending from the second board, and the assistant bus-bar assembly is positioned between the securing portion and the mounting portion.

20. The power supply system of claim 19, wherein the first main bus-bar comprises a first power guiding portion substantially perpendicular to the first board, the second main bus-bar comprises a second power guiding portion substantially perpendicular to the second board, and the second power guiding portion is attached to the first power guiding portion.

\* \* \* \* \*